US012782918B2

(12) United States Patent
Zheng et al.

(10) Patent No.: US 12,782,918 B2
(45) Date of Patent: Nov. 3, 2026

(54) SILICON CONTROLLED RECTIFIER SOAKING CONTROL METHOD AND APPARATUS, AND COMPUTER-READABLE STORAGE MEDIUM

(71) Applicant: VERTIV TECH CO., LTD., Shenzhen (CN)

(72) Inventors: Shulu Zheng, Shenzhen (CN); Qingfeng Zhuo, Shenzhen (CN)

(73) Assignee: Vertiv Tech Co., Ltd., Shenzhen (CN)

( * ) Notice: Subject to any disclaimer, the term of this patent is extended or adjusted under 35 U.S.C. 154(b) by 409 days.

(21) Appl. No.: 18/289,704

(22) PCT Filed: Aug. 27, 2021

(86) PCT No.: PCT/CN2021/114887
§ 371 (c)(1),
(2) Date: Nov. 6, 2023

(87) PCT Pub. No.: WO2022/267216
PCT Pub. Date: Dec. 29, 2022

(65) Prior Publication Data

US 2024/0255923 A1 Aug. 1, 2024

(30) Foreign Application Priority Data

Jun. 24, 2021 (CN) ......................... 202110707183.0

(51) Int. Cl.
*G05B 19/4155* (2006.01)
*H10D 89/60* (2025.01)

(52) U.S. Cl.
CPC ....... *G05B 19/4155* (2013.01); *H10D 89/713* (2025.01)

(58) Field of Classification Search
CPC ........... G05B 19/4155; G05D 23/1932; G05D 23/20; H02M 1/088; H02M 1/327; H10D 18/00
See application file for complete search history.

(56) References Cited

U.S. PATENT DOCUMENTS

| | | | |
|---|---|---|---|
| RE31,723 | E | 11/1984 | Shaw |
| 5,712,802 | A | 1/1998 | Kumar et al. |

(Continued)

FOREIGN PATENT DOCUMENTS

| | | | |
|---|---|---|---|
| CA | 2144615 | A1 | 9/1996 |
| CN | 86210440 | U | 12/1987 |

(Continued)

OTHER PUBLICATIONS

Extended European Search Report regarding Application No. 21946700.8, dated Sep. 2, 2024.

(Continued)

*Primary Examiner* — Vincent H Tran
(74) *Attorney, Agent, or Firm* — Harness, Dickey & Pierce, P.L.C.

(57) ABSTRACT

A silicon controlled rectifier soaking control method and apparatus, and a computer-readable storage medium. The method comprises: acquiring heating parameters of at least two silicon controlled rectifiers connected in parallel (ST1), wherein the at least two silicon controlled rectifiers comprise a first silicon controlled rectifier and a second silicon controlled rectifier, and the heating parameters comprise a first heating parameter of the first silicon controlled rectifier and a second heating parameter of the second silicon controlled rectifier; comparing the first heating parameter and the second heating parameter with a set threshold value, and adjusting trigger angles of the first silicon controlled rectifier and/or the second silicon controlled rectifier on the basis of the comparison results (ST2); and repeatedly executing step (Continued)

ST1 and step ST2 until a difference value between the first heating parameter and the second heating parameter is within a set difference value range (ST3).

11 Claims, 2 Drawing Sheets

(56) References Cited

U.S. PATENT DOCUMENTS

| | | | | |
|---|---|---|---|---|
| 6,614,639 | B1 * | 9/2003 | Gibbs | H02H 7/1257 361/103 |
| 2014/0002117 | A1 * | 1/2014 | Woodley | H02P 1/423 324/750.01 |
| 2016/0218621 | A1 | 7/2016 | Hayashi et al. | |
| 2019/0190311 | A1 | 6/2019 | Kao et al. | |
| 2020/0044576 | A1 * | 2/2020 | Besselmann | H02M 5/4505 |
| 2020/0186147 | A1 | 6/2020 | Shigeta et al. | |

FOREIGN PATENT DOCUMENTS

| | | | |
|---|---|---|---|
| CN | 1819263 | A | 8/2006 |
| CN | 101581755 | A | 11/2009 |
| CN | 202679284 | U | 1/2013 |
| CN | 104703355 | A | 6/2015 |
| CN | 105553361 | A | 5/2016 |
| CN | 105762785 | A | 7/2016 |
| CN | 106452134 | A | 2/2017 |
| DE | 102006019981 | A1 | 1/2007 |
| DE | 102012213725 | A1 | 2/2014 |
| EP | 1193756 | A1 | 4/2002 |
| JP | 2005130555 | A | 5/2005 |
| SU | 541285 | A1 | 12/1976 |
| SU | 877734 | A1 | 10/1981 |
| WO | 9739397 | A1 | 10/1997 |

OTHER PUBLICATIONS

Chinese Office Action regarding Application No. 202110707183.0, dated Mar. 15, 2023.

Chinese Office Action regarding Application No. 202110707183.0, dated Aug. 26, 2023.

Ruibing Bai et al, "The logic control and characteristics of the thyristor power regulator in the electric heater circuit to automatically adjust the power", Process Control, Aug. 2018, Issue 24, pp. 68-69.

International Search Report (English and Chinese) and Written Opinion of the ISA (Chinese) issued in PCT/CN2021/114887, mailed Mar. 23, 2022; ISA/CN.

European First Office Action regarding Application No. 21946700.8, dated Aug. 4, 2025.

* cited by examiner

SILICON CONTROLLED RECTIFIER SOAKING CONTROL METHOD AND APPARATUS, AND COMPUTER-READABLE STORAGE MEDIUM

The present application is a U.S. National Phase Application under 35 U.S.C. 371 of International Application No. PCT/CN2021/114887, filed on Aug. 27, 2021 which_claims priority to Chinese Patent Application No. 202110707183.0, titled "METHOD AND DEVICE FOR CONTROLLING UNIFORM HEAT GENERATION BY SILICON CONTROLLED RECTIFIERS AND COMPUTER-READABLE STORAGE MEDIUM", filed on Jun. 24, 2021 with the China National Intellectual Property Administration, the entire disclosures of which are incorporated herein by reference in their entirety.

FIELD

The present application relates to the field of control for silicon controlled rectifiers, and particularly to a method and a device for controlling uniform heat generation by silicon controlled rectifiers and a computer-readable storage medium.

BACKGROUND

A silicon controlled rectifier (referred to as "SCR"), also known as a thyristor, is a high-power electrical component, and has the advantages of small size, high efficiency, long life and the like. In automatic control systems, the silicon controlled rectifier is used to drive a high-power apparatus, making it possible to control the high-power apparatus with a low-power control. Therefore, the silicon controlled rectifier has been widely used in AC-DC motor speed control systems, power regulation systems, servo systems and uninterruptible power supply (UPS) systems.

The current capacity of one silicon controlled rectifier is limited, and therefore, generally, silicon controlled rectifiers are operated in parallel in order to carry a larger current. In addition, for distributed power supply, parallel operation of multiple apparatuses also involves parallel operation of silicon controlled rectifiers. For example, when an uninterrupted voltage parallel system operates on a bypass side, generally bypass SCRs of UPSs operate in parallel.

Difference in heat generation by silicon controlled rectifiers operating in parallel will decrease reliability of a system substantially, and also result in a bottleneck in load capacity of the system. Uneven heating of the silicon controlled rectifiers connected in parallel may be caused by many factors such as an uneven current, an uneven conduction voltage drop of the silicon controlled rectifiers, difference in heat dissipation conditions, and the like.

In actual application scenarios, current sharing is performed on parallel silicon controlled rectifiers. For example, impedance difference between loops of silicon controlled rectifiers in parallel is reduced by controlling cable lengths of the loops, so as to achieve current sharing. Alternatively, currents output by the loops of silicon controlled rectifiers are measured, and firing angles of respective silicon controlled rectifiers are regulated based on measured currents. However, these solutions have a common defect, that is, the current sharing between the loops of silicon controlled rectifiers in parallel is regarded as an ultimate goal of regulation and control, while ignoring the nature of the problems caused by the parallel silicon controlled rectifiers, failing to equate heat to be generated by the parallel silicon controlled rectifiers directly.

SUMMARY

In view of the above defects of the related art, a method and a device for controlling uniform heat generation by silicon controlled rectifiers and a computer-readable storage medium, which are simple and reliable, and could directly equate heat generated by the parallel silicon controlled rectifiers, are provided.

A technical solution adopted by the present application to solve the technical problem is to propose a method for controlling uniform heat generation by silicon controlled rectifiers. The method includes: ST1, acquiring heating parameters of at least two silicon controlled rectifiers connected in parallel, where the at least two silicon controlled rectifiers include a first silicon controlled rectifier and a second silicon controlled rectifier, and the heating parameters include a first heating parameter of the first silicon controlled rectifier and a second heating parameter of the second silicon controlled rectifier; ST2, comparing the first heating parameter and the second heating parameter with a set threshold respectively, and regulating a firing angle of the first silicon controlled rectifier and/or a firing angle of the second silicon controlled rectifier based on a comparison result; and ST3, repeating ST1 and ST2 until a difference between the first heating parameter and the second heating parameter is within a set difference range.

In the method for controlling uniform heat generation by silicon controlled rectifiers according to the present application, the first heating parameter and the second heating parameter each includes a temperature parameter or a thermal parameter.

In the method for controlling uniform heat generation by silicon controlled rectifiers according to the present application, ST1 may further include: acquiring a first loop current for the first silicon controlled rectifier, a second loop current for the second silicon controlled rectifier, a first silicon controlled rectifier voltage drop for the first silicon controlled rectifier and a second silicon controlled rectifier voltage drop for the second silicon controlled rectifier; and calculating a first thermal parameter of the first silicon controlled rectifier, as the first heating parameter, based on the first loop current, the first silicon controlled rectifier voltage drop and a power frequency period; and calculating a second thermal parameter of the second silicon controlled rectifier, as the second heating parameter, based on the second loop current, the second silicon controlled rectifier voltage drop and the power frequency period.

In the method for controlling uniform heat generation by silicon controlled rectifiers according to the present application, ST1 may further include: filtering the first thermal parameter and the second thermal parameter; and determining the filtered first thermal parameter as the first heating parameter and determining the filtered second thermal parameter as the second heating parameter.

In the method for controlling uniform heat generation by silicon controlled rectifiers according to the present application, acquiring the first loop current for the first silicon controlled rectifier, the second loop current for the second silicon controlled rectifier, the first silicon controlled rectifier voltage drop for the first silicon controlled rectifier and the second silicon controlled rectifier voltage drop for the second silicon controlled rectifier may include one of: acquiring the first loop current and the second loop current by online detection, acquiring the first silicon controlled rectifier voltage drop based on a first conduction voltage drop curve of the first silicon controlled rectifier, and acquiring the second silicon controlled rectifier voltage drop based on a second conduction voltage drop curve of the second silicon controlled rectifier; acquiring the first loop current and the second loop current by online detection, determining a first set voltage drop that is fixed at intervals or fixed as the first silicon controlled rectifier voltage drop, and determining a second set voltage drop that is fixed at intervals or fixed as the second silicon controlled rectifier voltage drop; acquiring the first loop current and the second loop current by online detection, calculating the first silicon controlled rectifier voltage drop by measuring a voltage across the first silicon controlled rectifier, and calculating the second silicon controlled rectifier voltage drop by measuring a voltage across the second silicon controlled rectifier; and acquiring the first loop current, the second loop current, the first silicon controlled rectifier voltage drop and the second silicon controlled rectifier voltage drop by online detection, directly.

In the method for controlling uniform heat generation by silicon controlled rectifiers according to the present application, ST1 may further include: acquiring a first temperature parameter of the first silicon controlled rectifier by detecting the first silicon controlled rectifier using a temperature sensor, as the first heating parameter; and acquiring a second temperature parameter of the second silicon controlled rectifier by detecting the second silicon controlled rectifier using a temperature sensor, as the second heating parameter.

In the method for controlling uniform heat generation by silicon controlled rectifiers according to the present application, ST2 may further include: setting a first set threshold and a second set threshold as the set threshold; comparing the first heating parameter with the first set threshold to obtain a first comparison result, and comparing the second heating parameter with the second set threshold to obtain a second comparison result; and regulating the firing angle of the first silicon controlled rectifier and/or the firing angle of the second silicon controlled rectifier based on the first comparison result and the second comparison result.

In the method for controlling uniform heat generation by silicon controlled rectifiers according to the present application, the first set threshold may be equal to or greater than the second set threshold.

In the method for controlling uniform heat generation by silicon controlled rectifiers according to the present application, regulating the firing angle of the first silicon controlled rectifier and/or the firing angle of the second silicon controlled rectifier based on the first comparison result and the second comparison result may include: increasing the firing angle of the first silicon controlled rectifier and controlling the firing angle of the second silicon controlled rectifier to remain unchanged, when the first heating parameter is greater than the first set threshold and the second heating parameter is less than the second set threshold; and increasing the firing angle of the second silicon controlled rectifier and controlling the firing angle of the first silicon controlled rectifier to remain unchanged, when the first heating parameter is less than the second set threshold and the second heating parameter is greater than the first set threshold.

In the method for controlling uniform heat generation by silicon controlled rectifiers according to the present application, each of the first set threshold and the second set threshold may be equal to an average of the first heating parameter and the second heating parameter.

In the method for controlling uniform heat generation by silicon controlled rectifiers according to the present application, ST2 may further include: determining a smaller one of the first heating parameter and the second heating parameter as the set threshold, increasing a firing angle of one of the first silicon controlled rectifier and the second silicon controlled rectifier, which is corresponding to a greater one of the first heating parameter and the second heating parameter, and/or reducing a firing angle of one of the first silicon controlled rectifier and the second silicon controlled rectifier, which is corresponding to the smaller one of the first heating parameter and the second heating parameter, based on the comparison result.

A technical solution adopted by the present application to solve the technical problem is to propose a device for controlling uniform heat generation by silicon controlled rectifiers. The device includes at least a first silicon controlled rectifier and a second silicon controlled rectifier connected in parallel, and a processor for controlling uniform heat generation by the first silicon controlled rectifier and the second silicon controlled rectifier. The processor has a computer program stored thereon, the computer program, when executed by the processor, implements the method for controlling uniform heat generation by silicon controlled rectifiers.

Another technical solution adopted by the present application to solve the technical problem is to propose a computer-readable storage medium, on which a computer program is stored. When the computer program is executed by a processor, the method for controlling uniform heat generation by silicon controlled rectifiers is implemented.

With the method and the device for controlling uniform heat generation by silicon controlled rectifiers as well as the computer-readable storage medium, firing angles of respective silicon controlled rectifiers connected in parallel are directly regulated based on comparison of heating parameters so as to equate heat generated by the silicon controlled rectifiers directly at source, instead of performing current sharing on the silicon controlled rectifiers connected in parallel.

BRIEF DESCRIPTION OF THE DRAWINGS

The present application is further described below with reference to the drawings and embodiments, in the drawings.

DETAILED DESCRIPTION

In the following, the present application will be described in further detail in conjunction with the drawings and embodiments, so that the purpose, technical solutions and advantages of the present application are clearer. It should be understood that the specific embodiments described herein are only used to explain the present application rather than intended to limit the present application.

A method for controlling uniform heat generation by silicon controlled rectifiers is provided according to the present application. The method includes: acquiring heating parameters of at least two silicon controlled rectifiers connected in parallel, wherein the at least two silicon controlled rectifiers include a first silicon controlled rectifier and a second silicon controlled rectifier, and the heating parameters include a first heating parameter of the first silicon controlled rectifier and a second heating parameter of the second silicon controlled rectifier (ST1); comparing the first heating parameter and the second heating parameter with a set threshold respectively, and regulating a firing angle of the first silicon controlled rectifier and/or a firing angle of the second silicon controlled rectifier based on a comparison result (ST2); and repeating ST1 and ST2 until a difference between the first heating parameter and the second heating parameter is within a set difference range (ST3). The method for controlling uniform heat generation by silicon controlled rectifiers according to the present application abandons the technical prejudice in the prior art that current sharing should be performed in order to equate heat generated by silicon controlled rectifiers. The present application creatively proposes a method in which firing angles of respective silicon controlled rectifiers connected in parallel are directly regulated based on direct comparison of the heating parameters, so as to equate heat generated by the silicon controlled rectifiers directly, instead of performing current sharing on the silicon controlled rectifiers connected in parallel.

Figure 1:
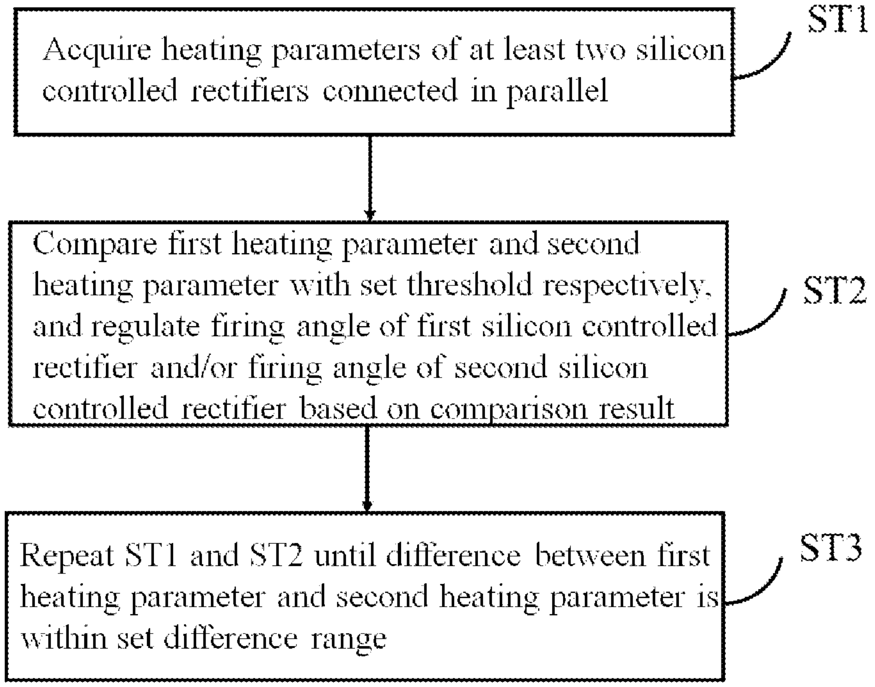
FIG. 1 is a flowchart illustrating a method for controlling uniform heat generation by silicon controlled rectifiers according to a first preferred embodiment of the present application.

FIG. 1 is a flowchart illustrating a method for controlling uniform heat generation by silicon controlled rectifiers according to a first preferred embodiment of the present application. As shown in FIG. 1, in step ST1, heating parameters of at least two silicon controlled rectifiers connected in parallel are acquired. The at least two silicon controlled rectifiers include a first silicon controlled rectifier and a second silicon controlled rectifier, and the heating parameters include a first heating parameter of the first silicon controlled rectifier and a second heating parameter of the second silicon controlled rectifier. In a preferred embodiment of the present application, the first heating parameter and the second heating parameter are temperature parameters, that is, a first temperature parameter of the first silicon controlled rectifier obtained by detecting the first silicon controlled rectifier through a temperature sensor, and a second temperature parameter of the second silicon controlled rectifier obtained by detecting the second silicon controlled rectifier through a temperature sensor. In another preferred embodiment of the present application, the first heating parameter and the second heating parameter are heating parameters, that is, a first thermal parameter of the first silicon controlled rectifier and a second thermal parameter of the second silicon controlled rectifier within a set period obtained or calculated by any known manner in the art. In a further preferred embodiment of the present application, the first thermal parameter of the first silicon controlled rectifier and the second thermal parameter of the second silicon controlled rectifier are filtered, respectively, so as to filter out noise points. Of course, the first thermal parameter of the first silicon controlled rectifier and the second thermal parameter of the second silicon controlled rectifier may be used directly.

In step ST2, each of the first heating parameter and the second heating parameter is compared with the set threshold, and a firing angle of the first silicon controlled rectifier and/or a firing angle of the second silicon controlled rectifier are regulated based on a comparison result. In a preferred embodiment of the present application, the set threshold may be an average of the first heating parameter and the second heating parameter, any suitable threshold set by those skilled in the art according to the actual situation, or the first heating parameter or the second heating parameter itself. There may be one or two or more set thresholds.

In a preferred embodiment of the present application, the firing angle of the first silicon controlled rectifier may be regulated (that is, increased or reduced as required), and the firing angle of the second silicon controlled rectifier remains unchanged. Alternatively, the firing angle of the second silicon controlled rectifier may be regulated (that is, increased or decreased as required), and the firing angle of the first silicon controlled rectifier remains unchanged. Alternatively, both the firing angle of the first silicon controlled rectifier and the firing angle of the second silicon controlled rectifier are regulated, that is, one is increased and the other is decreased. The purpose of the regulation is to make the first heating parameter and the second heating parameter be close to each other, for example, to make the difference between the first heating parameter and the second heating parameter be within a set difference range. Preferably, the difference is set to be close to zero.

In a preferred embodiment of the present application, a smaller one of the first heating parameter and the second heating parameter is determined as the set threshold, and a firing angle of one of the first silicon controlled rectifier and the second silicon controlled rectifier, which is corresponding to a greater one of the first heating parameter and the second heating parameter is increased, and a firing angle of one of the first silicon controlled rectifier and the second silicon controlled rectifier, which is corresponding to the smaller one of the first heating parameter and the second heating parameter is decreased, based on the comparison result. Alternatively, the firing angle of the one of the first silicon controlled rectifier and the second silicon controlled rectifier, which is corresponding to the greater one of the first heating parameter and the second heating parameter is increased, and the firing angle of the one of the first silicon controlled rectifier and the second silicon controlled rectifier, which is corresponding to the smaller one of the first heating parameter and the second heating parameter remains unchanged. Alternatively, the firing angle of the one of the first silicon controlled rectifier and the second silicon controlled rectifier, which is corresponding to the smaller one of the first heating parameter and the second heating parameter is decreased, and the firing angle of the one of the first silicon controlled rectifier and the second silicon controlled rectifier, which is corresponding to the greater one of the first heating parameter and the second heating parameter remains unchanged. In an example, the greater one of the first heating parameter and the second heating parameter is determined as the set threshold for comparison, and the regulation is performed similarly.

In step ST3, the steps ST1 and ST2 are repeated until the difference between the first heating parameter and the second heating parameter is within the set difference range. Preferably, when the first heating parameter is equal or approximately equal to the second heating parameter, heat generated by the first silicon controlled rectifier is considered to be equal to heat generated by the second silicon controlled rectifier.

As known by those skilled in the art, although in the embodiment shown in FIG. 1, two silicon controlled rectifiers connected in parallel are taken as an example, actually, the above method may be applied to an embodiment in which multiple silicon controlled rectifiers are connected in parallel. Based on the teaching of the present disclosure, those skilled in the art could apply this method to multiple silicon controlled rectifiers connected in parallel.

Therefore, the present application creatively proposes that firing angles of respective silicon controlled rectifiers connected in parallel are directly regulated based on direct comparison of the heating parameters, so as to equate heat generated by the silicon controlled rectifiers directly, instead of performing current sharing on the silicon controlled rectifiers connected in parallel.

Figure 2:
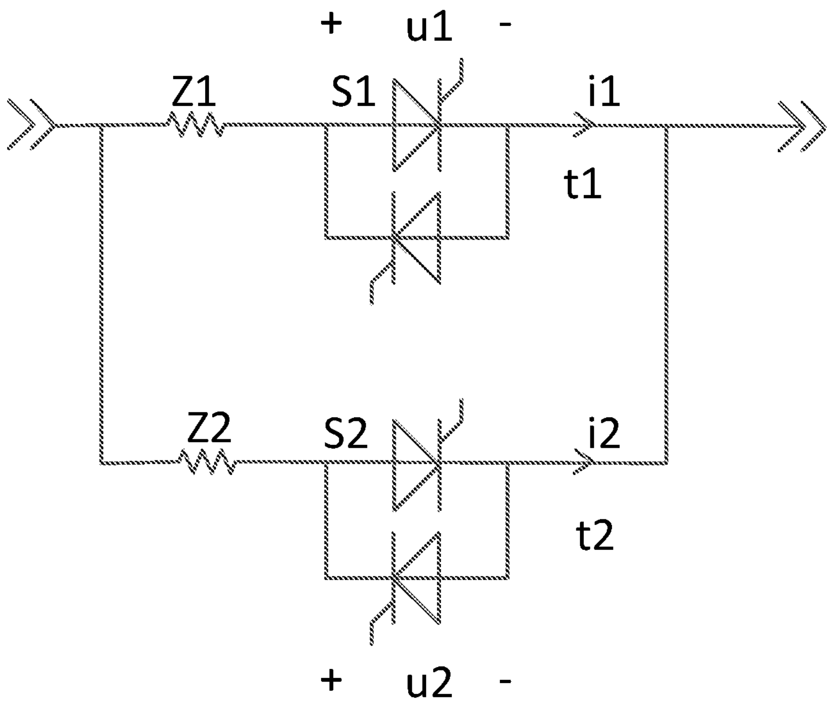
FIG. 2 is a schematic circuit diagram of silicon controlled rectifiers connected in parallel to which the method for controlling uniform heat generation by silicon controlled rectifiers according to the present application is applicable.

FIG. 2 is a schematic circuit diagram of silicon controlled rectifiers connected in parallel to which the method for controlling uniform heat generation by silicon controlled rectifiers according to the present application is applicable. Various preferred embodiments of the present application will be further described below with reference to FIG. 2.

In the parallel silicon controlled rectifier circuit shown in FIG. 2, two bidirectional silicon controlled rectifiers S1 and S2 operate in parallel, and loop impedances of their loops are Z1 and Z2, respectively. First loop current and second loop current are i1 and i2 respectively. A voltage drop across a first silicon controlled rectifier S1 is u1. A voltage drop across a second silicon controlled rectifier S2 is u2. Generally, $Z1 \neq Z2$, and $i1 \neq i2$.

In a preferred embodiment of the present application, for the parallel silicon controlled rectifier circuit shown in FIG. 2, the method for controlling uniform heat generation by silicon controlled rectifiers according to a preferred embodiment of the present application includes the following steps (1) to (5).

(1) The first loop current i1, the second loop current i2, the first silicon controlled rectifier voltage drop u1 and the second silicon controlled rectifier voltage drop u2 are acquired.

In a preferred embodiment of the present application, the first loop current i1, the second loop current i2, the first silicon controlled rectifier voltage drop u1 and the second silicon controlled rectifier voltage drop u2 may be acquired by online detection, directly.

In another preferred embodiment of the present application, only the first loop current i1 and the second loop current i2 are acquired by online detection, without measuring the first silicon controlled rectifier voltage drop u1 and the second silicon controlled rectifier voltage drop u2. Instead, the first silicon controlled rectifier voltage drop u1 and the second silicon controlled rectifier voltage drop u2 are respectively calculated based on conduction voltage drop curves in a device manual provided by a manufacturer of the silicon controlled rectifiers. That is, the first silicon controlled rectifier voltage drop u1 is acquired based on a first conduction voltage drop curve of the first silicon controlled rectifier S1, and the second silicon controlled rectifier voltage drop u2 is acquired based on a second conduction voltage drop curve of the second silicon controlled rectifier S2.

In another preferred embodiment of the present application, only the first loop current i1 and the second loop current i2 may be acquired by online detection, without measuring the first silicon controlled rectifier voltage drop u1 and the second silicon controlled rectifier voltage drop u2. Instead, a first set voltage drop that is fixed at intervals or fixed is determined as the first silicon controlled rectifier voltage drop u1, and a second set voltage drop that is fixed at intervals or fixed is determined as the second silicon controlled rectifier voltage drop u2. The first set voltage drop and the second set voltage drop may be selected and set according to the conduction voltage drop curves in the device manual provided by the manufacturer of the silicon controlled rectifiers, or may be set according to circuit requirements. Those skilled in the art can perform settings in any known manners.

In another preferred embodiment of the present application, only the first loop current i1 and the second loop current i2 are acquired by online detection, without measuring the first silicon controlled rectifier voltage drop u1 and the second silicon controlled rectifier voltage drop u2. Instead, the first silicon controlled rectifier voltage drop u1 is calculated by measuring a voltage across the first silicon controlled rectifier S1, and the second silicon controlled rectifier voltage drop u2 is calculated by measuring a voltage across the second silicon controlled rectifier S2.

As known by those skilled in the art, the above are only preferred embodiments, and those skilled in the art may acquire the first loop current i1, the second loop current i2, the first silicon controlled rectifier voltage drop u1 and the second silicon controlled rectifier voltage drop u2 in any suitable manner according to the actual situation. For example, the first silicon controlled rectifier voltage drop u1 and the second silicon controlled rectifier voltage drop u2 are measured, and the first loop current i1 and the second loop current i2 are calculated.

(2) A first thermal parameter Q1 of the first silicon controlled rectifier S1 for n power frequency periods is calculated based on the first loop current i1, the first silicon controlled rectifier voltage drop u1 and a power frequency period T, and a second thermal parameter Q2 of the second silicon controlled rectifier S2 is calculated based on the second loop current i2, the second silicon controlled rectifier voltage drop u2 and the power frequency period T.

That is, $$Q1 = \int_0^{nT} u1(t)i1(t)dt,\ Q2 = \int_0^{nT} u2(t)i2(t)dt,$$

where T is the power frequency period, and n is a natural number greater than 0.

(3) The first thermal parameter Q1 and the second thermal parameter Q2 are filtered to obtain the filtered first thermal parameter Q1 and the filtered second thermal parameter Q2. In other preferred embodiments of the present application, such filtering may be omitted.

(4) An appropriate set threshold is selected, each of the first thermal parameter Q1 and the second thermal parameter Q2 is compared with the set threshold, and the firing angle of the first silicon controlled rectifier and/or the firing angle of the second silicon controlled rectifier are regulated based on a comparison result.

In a preferred embodiment of the present application, an average Qavrg of the first thermal parameter Q1 and the second thermal parameter Q2 is calculated, and each of the first thermal parameter Q1 and the second thermal parameter Q2 is compared with the average Qavrg. If Q1>Qavrg and Q2<Qavrg, the firing angle of the first silicon controlled rectifier S1 is increased and the firing angle of the second silicon controlled rectifier S2 remains unchanged. If Q2>Qavrg, and $Q_1$<Qavrg, the firing angle of the second silicon controlled rectifier S2 is increased and the firing angle of the first silicon controlled rectifier S1 remains unchanged.

In another preferred embodiment of the present application, the average Qavrg may be replaced by an appropriate constant threshold.

In another preferred embodiment of the present application, a first set threshold QS1 and a second set threshold QS2 are set, where QS1>QS2. The first thermal parameter Q1 and the second thermal parameter Q2 are compared with the first set threshold QS1 and the second set threshold QS2 respectively. When the first thermal parameter Q1 is greater than the first set threshold QS1 and the second thermal parameter Q2 is smaller than the second set threshold QS2, the firing angle of the first silicon controlled rectifier S1 is increased and the firing angle of the second silicon controlled rectifier S2 is controlled to remain unchanged. Alternatively, the firing angle of the second silicon controlled rectifier S2 may reduced and the firing angle of the first silicon controlled rectifier S1 remains unchanged, or the firing angle of the first silicon controlled rectifier S1 is increased and the firing angle of the second silicon controlled rectifier S2 is reduced. On the other hand, when the first thermal parameter Q1 is less than the second set threshold QS2 and the second thermal parameter Q2 is greater than the first set threshold QS1, the firing angle of the second silicon controlled rectifier S2 is increased and the firing angle of the first silicon controlled rectifier S1 is controlled to remain unchanged. Alternatively, the firing angle of the first silicon controlled rectifier S1 is reduced and the firing angle of the second silicon controlled rectifier S2 remains unchanged, or the firing angle of the first silicon controlled rectifier S1 is reduced and the firing angle of the second silicon controlled rectifier S2 is increased.

(5) Steps (1) to (4) are repeated until Q1~Q2. Here, "Q1~Q2" may be understood as a case in which a difference between the first thermal parameter Q1 and the second thermal parameter Q2 is an acceptable error which is set depending on actual conditions. In addition, for example, "Q1~Q2" may also be set such that the difference between the first thermal parameter Q1 and the second thermal parameter Q2 is within a set range.

In another preferred embodiment of the present application, for the parallel silicon controlled rectifier circuit shown in FIG. 2, the method for controlling uniform heat generation by the silicon controlled rectifiers according to a preferred embodiment the present application includes the following steps (1) to (3).

(1) The first silicon controlled rectifier S1 and the second silicon controlled rectifier S2 are detected by using a temperature sensor to obtain a first temperature parameter t1 of the first silicon controlled rectifier S1 and a second temperature parameter t2 of the second silicon controlled rectifier S2.

(2) An appropriate set threshold is selected, the first temperature parameter t1 and the second temperature parameter t2 each is compared with the set threshold, and the firing angle of the first silicon controlled rectifier S1 and/or the firing angle of the second silicon controlled rectifier S2 are regulated based on a comparison result.

In this preferred embodiment, as mentioned above, one or more temperature set thresholds may be directly set, or an average of the first temperature parameter t1 and the second temperature parameter t2 may be set as the set threshold. In this embodiment, the regulation of the firing angle of the first silicon controlled rectifier S1 and/or the firing angle of the second silicon controlled rectifier S2 may refer to step (4) in the above embodiment in which thermal parameters are used, and thus is not described in detail.

(3) Steps (1) to (2) are repeated until t1≈t2. Here, "t1≈t2" may be understood as a a case in which difference between the first temperature parameter t1 and the second temperature parameter t2 is an acceptable error which is set depending on actual conditions. In addition, for example, "t1≈t2" may also be set such that the difference between the first temperature parameter t1 and the second temperature parameter t2 is within a set range.

The method for controlling uniform heat generation by silicon controlled rectifiers according to the present application abandons the technical prejudice in the prior art that current sharing should be performed in order to equate heat generated by silicon controlled rectifiers. The present application creatively proposes a method in which firing angles of respective silicon controlled rectifiers connected in parallel are directly regulated based on comparison of the heating parameters, so as to equate heat generated by the silicon controlled rectifiers directly, instead of performing current sharing on the silicon controlled rectifiers connected in parallel. In addition, the determination may be performed based on a variety of heating parameters, and therefore the method is flexible and adaptable to various application scenarios.

Figure 3:
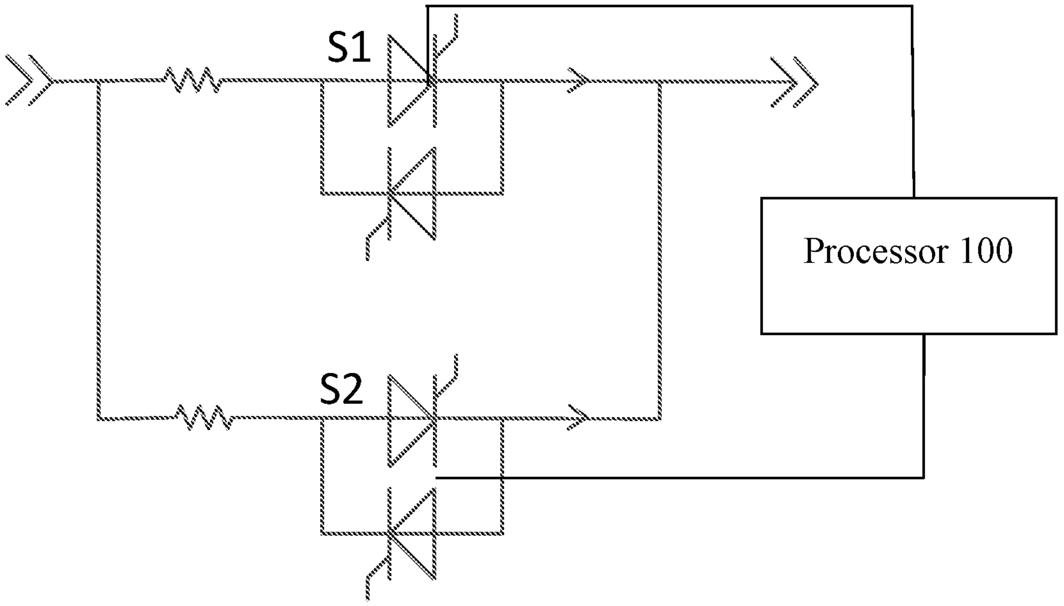
FIG. 3 is a schematic diagram illustrating a device for controlling uniform heat generation by silicon controlled rectifiers according to the present application.

FIG. 3 is a schematic diagram illustrating a device for controlling uniform heat generation by silicon controlled rectifiers according to the present application. As shown in FIG. 3, the device for controlling uniform heat generation by silicon controlled rectifiers includes at least a first silicon controlled rectifier S1 and a second silicon controlled rectifier S2 connected in parallel, and a processor 100 for controlling uniform heat generation by the first silicon controlled rectifier S1 and the second silicon controlled rectifier S2. The processor 100 has a computer program stored thereon, the computer program, when executed by the processor 100, implements the method for controlling uniform heat generation by silicon controlled rectifiers described in any of the embodiments in FIGS. 1 to 2.

The present application also relates to a computer-readable storage medium, on which a computer program is stored. When the computer program is executed by a processor, the method for controlling uniform heat generation by silicon controlled rectifiers described in any embodiment in FIGS. 1 to 2 is implemented. The computer program includes all features allowing the method of the present application to be implemented. When the computer program is installed in a computer system, the method of the present application can be implemented. The computer program in this document refers to any expression of a set of instructions that could be written in any programming language, codes or symbols. This set of instructions enables the system to have information processing capabilities to directly implement a specific function, or to implement a specific function after performing a) conversion into another language, code or symbol; and/or b) reproduction in a different format.

The present application may also be implemented by hardware, software or a combination of software and hardware. The present application may be implemented in a centralized fashion in at least one computer system, or in a decentralized fashion in different parts distributed over several interconnected computer systems. Any computer system or other equipment that can implement the method of the present application is applicable. The commonly used combination of software and hardware may be a generalpurpose computer system with a computer program installed therein, and the computer system is controlled by installing and executing the program to run according to the method of the present application.

Although the present application is described through specific embodiments, those skilled in the art should understand that various changes and equivalent substitutions may also be made to the present application without departing from the scope of the present application. In addition, various modifications may be made to the present application for a particular situation or material without departing from the scope of the present application. Therefore, the present application is not to be limited to the specific embodiments disclosed, but should include all implementations falling within the scope of the claims of the present application.

The embodiments described above are only preferred embodiments of the present application, and are not intended to limit the present application. Any modifications, equivalent replacements and improvements made within the spirit and principle of the present application shall be included within the protection scope of the present application.

The invention claimed is:

1. A method for controlling uniform heat generation by silicon controlled rectifiers, comprising:

ST1, acquiring heating parameters of at least two silicon controlled rectifiers connected in parallel, wherein the at least two silicon controlled rectifiers comprise a first silicon controlled rectifier and a second silicon controlled rectifier, and the heating parameters comprise a first heating parameter of the first silicon controlled rectifier and a second heating parameter of the second silicon controlled rectifier;

ST2, comparing the first heating parameter and the second heating parameter with a set threshold respectively, and regulating a firing angle of the first silicon controlled rectifier and/or a firing angle of the second silicon controlled rectifier based on a comparison result;

ST3, repeating ST1 and ST2 until a difference between the first heating parameter and the second heating parameter is within a set difference range, wherein ST1 further comprises:

acquiring a first loop current for the first silicon controlled rectifier, a second loop current for the second silicon controlled rectifier, a first silicon controlled rectifier voltage drop for the first silicon controlled rectifier and a second silicon controlled rectifier voltage drop for the second silicon controlled rectifier;

calculating a first thermal parameter of the first silicon controlled rectifier, as the first heating parameter, based on the first loop current, the first silicon controlled rectifier voltage drop and a power frequency period; and calculating a second thermal parameter of the second silicon controlled rectifier, as the second heating parameter, based on the second loop current, the second silicon controlled rectifier voltage drop and the power frequency period, and wherein acquiring the first loop current for the first silicon controlled rectifier, the second loop current for the second silicon controlled rectifier, the first silicon controlled rectifier voltage drop for the first silicon controlled rectifier and the second silicon controlled rectifier voltage drop for the second silicon controlled rectifier comprises one of:

acquiring the first loop current and the second loop current by online detection, acquiring the first silicon controlled rectifier voltage drop based on a first conduction voltage drop curve of the first silicon controlled rectifier, and acquiring the second silicon controlled rectifier voltage drop based on a second conduction voltage drop curve of the second silicon controlled rectifier;

acquiring the first loop current and the second loop current by online detection, determining a first set voltage drop that is fixed at intervals or fixed as the first silicon controlled rectifier voltage drop, and determining a second set voltage drop that is fixed at intervals or fixed as the second silicon controlled rectifier voltage drop;

acquiring the first loop current and the second loop current by online detection, calculating the first silicon controlled rectifier voltage drop by measuring a voltage across the first silicon controlled rectifier, and calculating the second silicon controlled rectifier voltage drop by measuring a voltage across the second silicon controlled rectifier; and acquiring the first loop current, the second loop current, the first silicon controlled rectifier voltage drop and the second silicon controlled rectifier voltage drop by online detection, directly.

2. The method for controlling uniform heat generation by silicon controlled rectifiers according to claim 1, wherein ST1 further comprises:

filtering the first thermal parameter and the second thermal parameter; and determining the filtered first thermal parameter as the first heating parameter and determining the filtered second thermal parameter as the second heating parameter.

3. The method for controlling uniform heat generation by silicon controlled rectifiers according to claim 2, wherein ST2 further comprises:

setting a first set threshold and a second set threshold as the set threshold;

comparing the first heating parameter with the first set threshold to obtain a first comparison result, and comparing the second heating parameter with the second set threshold to obtain a second comparison result; and regulating the firing angle of the first silicon controlled rectifier and/or the firing angle of the second silicon controlled rectifier based on the first comparison result and the second comparison result.

4. The method for controlling uniform heat generation by silicon controlled rectifiers according to claim 2, wherein ST2 further comprises:

determining a smaller one of the first heating parameter and the second heating parameter as the set threshold, increasing the firing angle of one of the first silicon controlled rectifier and the second silicon controlled rectifier corresponding to a greater one of the first heating parameter and the second heating parameter, and/or reducing the firing angle of one of the first silicon controlled rectifier and the second silicon controlled rectifier corresponding to the smaller one of the first heating parameter and the second heating parameter, based on the comparison result.

5. The method for controlling uniform heat generation by silicon controlled rectifiers according to claim 1, wherein ST2 further comprises:

setting a first set threshold and a second set threshold as the set threshold;

comparing the first heating parameter with the first set threshold to obtain a first comparison result, and comparing the second heating parameter with the second set threshold to obtain a second comparison result; and regulating the firing angle of the first silicon controlled rectifier and/or the firing angle of the second silicon controlled rectifier based on the first comparison result and the second comparison result.

6. The method for controlling uniform heat generation by silicon controlled rectifiers according to claim 5, wherein the first set threshold is equal to or greater than the second set threshold.

7. The method for controlling uniform heat generation by silicon controlled rectifiers according to claim 6, wherein regulating the firing angle of the first silicon controlled rectifier and/or the firing angle of the second silicon controlled rectifier based on the first comparison result and the second comparison result comprises:

increasing the firing angle of the first silicon controlled rectifier and controlling the firing angle of the second silicon controlled rectifier to remain unchanged, when the first heating parameter is greater than the first set threshold and the second heating parameter is less than the second set threshold; and increasing the firing angle of the second silicon controlled rectifier and controlling the firing angle of the first silicon controlled rectifier to remain unchanged, when the first heating parameter is less than the second set threshold and the second heating parameter is greater than the first set threshold.

8. The method for controlling uniform heat generation by silicon controlled rectifiers according to claim 7, wherein each of the first set threshold and the second set threshold is equal to an average of the first heating parameter and the second heating parameter.

9. The method for controlling uniform heat generation by silicon controlled rectifiers according to claim 1, wherein ST2 further comprises:

determining a smaller one of the first heating parameter and the second heating parameter as the set threshold, increasing the firing angle of one of the first silicon controlled rectifier and the second silicon controlled rectifier corresponding to a greater one of the first heating parameter and the second heating parameter, and/or reducing the firing angle of one of the first silicon controlled rectifier and the second silicon controlled rectifier corresponding to the smaller one of the first heating parameter and the second heating parameter, based on the comparison result.

10. A device for controlling uniform heat generation by silicon controlled rectifiers, comprising: at least a first silicon controlled rectifier and a second silicon controlled rectifier connected in parallel; and a processor for controlling uniform heat generation by the first silicon controlled rectifier and the second silicon controlled rectifier, wherein the processor has a computer program stored thereon, the computer program, when executed by the processor, implements the method according to claim 1.

11. A computer-readable storage medium having a computer program stored therein, wherein the computer program, when executed by a processor, implements the method for controlling uniform heat generation by silicon controlled rectifiers according to claim 1.

* * * * *